United States Patent [19]

Yokota

[11] Patent Number: 4,516,242
[45] Date of Patent: May 7, 1985

[54] OUTPUT STABILIZING DEVICE

[75] Inventor: Tsuneshi Yokota, Kawasaki, Japan

[73] Assignee: Tokyo Shibaura Denki Kabushiki Kaisha, Kawasaki, Japan

[21] Appl. No.: 388,172

[22] Filed: Jun. 14, 1982

[30] Foreign Application Priority Data

Jun. 18, 1981 [JP] Japan .................................. 56-94429
Mar. 15, 1982 [JP] Japan .................................. 57-40601

[51] Int. Cl.$^3$ ............................................. H01S 3/13
[52] U.S. Cl. ...................................... 372/29; 372/26; 350/358; 350/162.12
[58] Field of Search ....................... 372/29, 31, 26, 34, 372/9, 38; 350/162.12, 358

[56] References Cited

U.S. PATENT DOCUMENTS 4,355,395 10/1982 Satter et al. ............................ 372/38

FOREIGN PATENT DOCUMENTS 141590 11/1979 Japan ...................................... 372/29
2025121 1/1980 United Kingdom ................... 372/29

Primary Examiner—William L. Sikes
Assistant Examiner—Léon Scott, Jr.
Attorney, Agent, or Firm—Cushman, Darby & Cushman

[57] ABSTRACT

An output stabilizing device for semiconductor laser oscillator is provided with an optical sensor for converting a monitor laser beam emitted from a semiconductor laser oscillator to a monitor signal. A monitor signal from the optical sensor is supplied to an envelope detector by which a minimum value envelope of the monitor signal is detected by the envelope detector. The minimum value envelope is compared with a reference signal for setting a level of a playback laser output in the comparator. The modulating signal is added to the compared signal from the comparator, i.e., the difference signal. The drive current corresponding to the added signal from the adder is supplied to the semiconductor laser oscillator.

6 Claims, 7 Drawing Figures

OUTPUT STABILIZING DEVICE

BACKGROUND OF THE INVENTION

The present invention relates to an output stabilizing device and more particularly to an output stabilizing device for use with semiconductor laser oscillators.

The semiconductor laser oscillators have been used in a variety of apparatuses because of their useful features such as small size and light weight. A typical example of the applications to which the semiconductor laser oscillator is applied, is an optical disk apparatus in which an optical disk is irradiated with a laser beam produced from a semiconductor laser oscillator assembled into an optical head for recording information in a high density and playing back the recorded information. The optical disk apparatus can record a great amount of information. Because of this feature, it has application in a document filing system for recording and playing back image information. The semiconductor laser oscillator assembled into the optical head in the optical disk apparatus is sensitive to changes in the ambient temperature and its change is great. That is problematic from an oscillation stability standpoint. An oscillation threshold current of the general semiconductor laser oscillator depends on a junction temperature Tj and is given by the following expression:

$$Ith \; exp(Tj/To)$$

Therefore, when a junction temperature changes by 50° C., the oscillating output power changes in a great range from the power at no oscillation to the maximum oscillation power, even if the drive current is constant. A general countermeasure taken for this problem is to apply feedback to a drive circuit of the semiconductor laser oscillator. A prior feedback method is such that part of the output power of the laser oscillator is detected in the form of a monitor beam and the monitor beam is simply fed back. This method is effective for stabilizing the laser output power when it is applied in the case where the optical disk apparatus is used only for playback, and the semiconductor laser oscillator plays back the playback laser. When applied to an optical disk apparatus for both recording and playing back purposes, however, it fails to obtain stable oscillating output power of both the playback laser and the record laser, because the playback laser output (low output power) range and a record laser output (high output power) range are selectively switched according to the operation mode of a record mode or a playback mode.

In an optical disk apparatus capable of performing both record and playback, the semiconductor oscillator produces the playback laser at low levels at all times. With the playback laser beam, a prepit array or a pregroove formed on the optical disk is traced to effect the tracking. When a modulating signal corresponding to data for recording, which is a pulse signal with a pulse width of several hundreds ns or less, is applied to the semiconductor laser oscillator, the semiconductor laser oscillator is changed to a high level range during the period of the modulating signal supplied for the semiconductor laser oscillator, so that it produces a high level laser beam, i.e. a recording laser beam. At this time, the recording laser beam has energy necessary for melting and deforming a metal film of the optical disk, which is several tens times the playback laser beam, for example. Accordingly, at this time, the monitor laser beam is several tens times or more than that at the time of playback. When such a high level monitor laser beam is detected by the monitor laser beam detector, the detector generates high level monitor pulses to greatly influence the operation of the optical head circuit. The result is that the operation of the optical head is remarkably unstable, possibly causing an erroneous operation.

SUMMARY OF THE INVENTION

An object of the present invention is to provide an output stabilizing device for a semiconductor laser oscillator capable of producing a stable oscillating output power from the semiconductor laser oscillator irrespective in the variation of a junction temperature and the switching of an oscillating output level.

According to the present invention, there is provided an output stabilizing device for a semiconductor laser device comprising a monitor sensor for sensing a laser beam emitted from a semiconductor laser oscillator as a monitor laser beam, means for generating a signal containing only minimum level components of the monitor signal from the monitor sensor, means for comparing a signal from said generating means with a reference signal to produce a signal representing a difference between said signals, and means for controlling the output power of said semiconductor oscillator according to the difference signal.

DETAILED DESCRIPTION OF THE PREFERRED EMBODIMENTS

Figure 1:
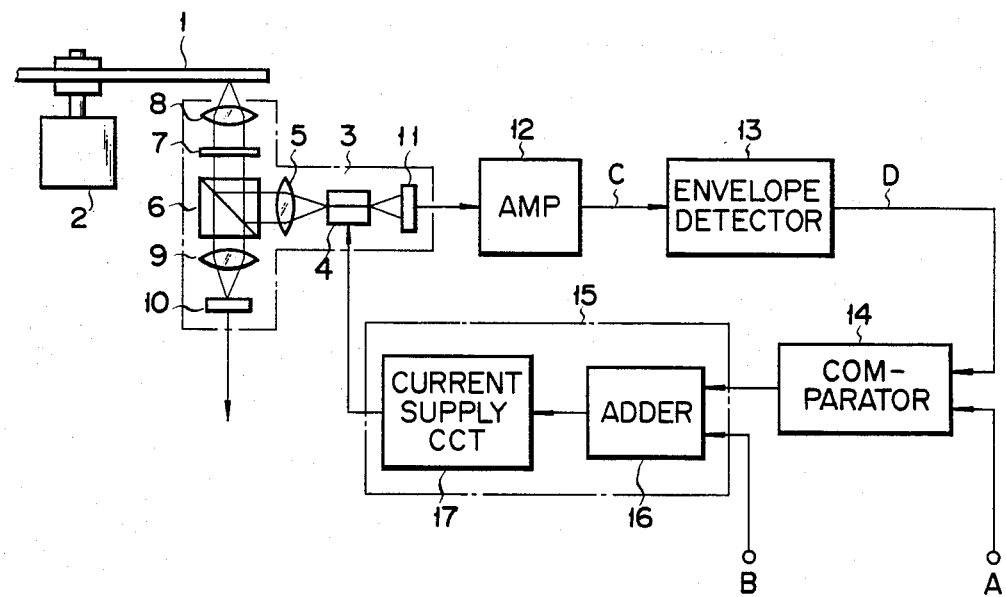
FIG. 1 shows a schematic diagram of an optical disk apparatus using an output stabilizing device according to an embodiment of the present invention.

Referring to FIG. 1, there is shown an optical disk apparatus incorporating an output stabilizing device according to the present invention.

In FIG. 1, an optical disk 1 having spiral or coaxial tracks formed of a pregroove or a prepit array is provided so as to be rotated by a motor 2. An optical head 3 is movable in a radial direction of the optical disk 1. The optical head 3 is provided with a semiconductor laser oscillator 4. A collimator lens 5 and a beam splitter 6 are disposed along a laser path on the main output side of the semiconductor laser oscillator 4. A λ/4 (quarter-wave) plate 7 and an objective lens 8 are disposed in a direction orthogonal to the laser path on the optical disk side of the beam splitter 6. A condenser lens 9 and an optical sensor 10 are disposed on the opposite side to the optical disk side.

A monitor optical sensor 11 is disposed on the monitor output side of the semiconductor laser oscillator 4. The output terminal of the monitor optical sensor 11 is connected to an input terminal of an envelope detector 13 through an amplifier 12. The output terminal of the envelope detector 13 is connected to one of the input terminals of a comparator 14. The other input terminal of the comparator 14 is connected to a reference signal source (not shown) for generating a reference signal A. The output terminal of the comparator 14 is connected to one of the input terminals of an adder 16 of a laser oscillator drive circuit 15. The other input terminal of the adder 16 is connected to a modulating signal generator (not shown) for generating a laser beam modulating signal B. The output terminal of the adder 16 is connected to an input terminal of a current supply circuit 17. The output terminal of the current supply circuit 17 is connected to the semiconductor laser oscillator 4.

The operation of the above-mentioned circuit will be described. For recording document information, for example, into an optical disk 1, the optical head 3 is moved onto a given track on the optical disk 1 and then the laser oscillator 4 generates a playback laser beam. The playback laser beam is collimated by the collimator lens 5 and incident on a beam splitter 6. The beam splitter 6 reflects the laser beam towards the optical disk 1. At this time, the laser beam is filtered out by the λ/4 plate 7 and focused, by the objective lens 8, into a beam spot with a diameter of 1 μm at the track of the optical disk 1. The laser beam reflected from the optical disk 1 enters the optical sensor 10, through the objective lens 8, the λ/4 plate 7, the beam splitter 6 and the condenser lens 9. The optical sensor 10 is a quartered optical sensor, for example. The photoelectric signals from the optical sensor 10 are supplied to a known tracking servo unit (not shown) for tracking control purposes and to a known focusing unit (not shown) for focusing control purposes.

The monitor laser beam coming from the monitor output side of the semiconductor laser oscillator 4 is converted into a photoelectric monitor signal by the monitor optical sensor 11. The monitor signal from the monitor optical sensor 11 is amplified by the amplifier 12 and outputted as a monitor signal C shown in FIG. 2. The monitor signal C is supplied to an envelope detector 13 by which a minimum value envelope of the monitor signal C is detected. The envelope signal D of the envelope detector 13 is supplied to the comparator 14 in which it is compared with the reference signal A. The comparator 14 produces a signal representing a difference between the reference signal A and the envelope signal D. The difference signal is supplied to the adder 16 of the drive circuit 15 and is added to the modulating signal B. The modulating signal B is at 0 V in a playback mode, so that the adder 16 produces the difference signal for transfer to the current supply circuit 17. The current supply circuit 17 supplies a drive signal corresponding to the difference signal to the semiconductor laser oscillator 4. The semiconductor laser oscillator 4 produces a playback laser beam corresponding to the drive current.

Figure 3:
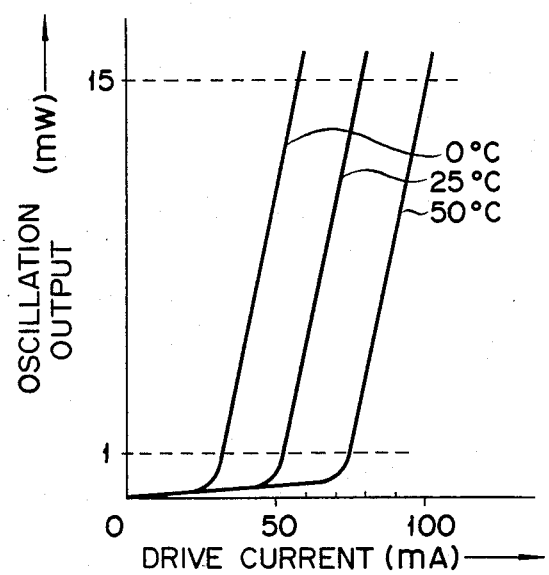
FIG. 3 shows oscillating characteristic curves of a semiconductor laser oscillator.

The semiconductor laser oscillator 4 has a forward current laser output characteristic, as shown in FIG. 3. As seen from the characteristic curve, the oscillation threshold current of the semiconductor laser oscillator 4 changes greatly with temperature. In the oscillation range, i.e. a range from the oscillation output 1 mW to 15 mW, the oscillation output-to-current value is constant. The characteristic curve shows that when a 54 mA drive current is supplied to the semiconductor laser oscillator 4, a 1 mW oscillating output power is produced. If the 1 mW oscillating output power is appropriate for the playback, the level of the reference signal A is set so as to have the 1 mW oscillating output power. Accordingly, when the junction temperature rises to 50° C., the oscillating output power abruptly decreases, and then the level 13 drops. The result is that a difference between the envelope signal D and the reference signal A is large to cause the comparator 14 to produce the increased and large difference signal. The difference signal is supplied through the adder 16 to the current supply circuit 17. Then, the drive current increases according to the difference signal level, thereby to obtain the 1 mW oscillating output power. In this way, the forward current supplied to the semiconductor laser oscillator is controlled according to the junction temperature, with the result that the semiconductor laser oscillator 4 always produces a constant playback laser beam.

Figure 2:
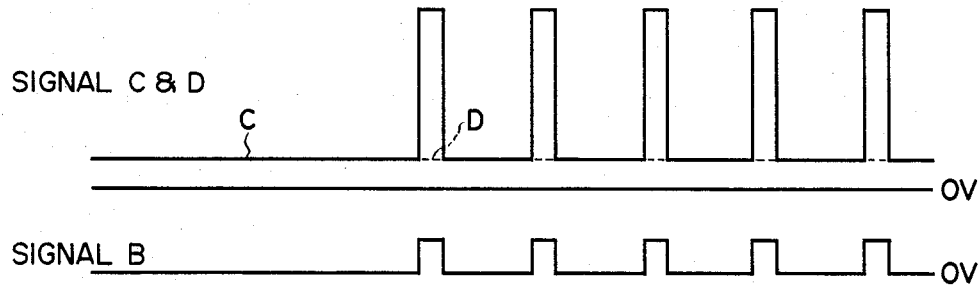
FIG. 2 shows time charts useful in explaining the operation of the output stabilizing device shown in FIG. 1.

With the laser beam thus produced, the track pit array or track groove is traced. During the course of tracking, when a record mode command is applied to the optical disk apparatus, a beam modulating signal B corresponding to the recording data, i.e. a record pulse signal B with a pulse width of several hundreds ns or less, is supplied to the adder 16. The record pulse signal B is added, in the adder 16, to the difference signal from the comparator 14. When the adder signal is supplied to the current supply circuit 17, the drive current according to the pulse width of the record pulse signal B is supplied, by the current supply circuit 17, to the laser oscillator 4, thereby to switch the output level of the laser oscillator 4 to a high level. As a result, the laser oscillator 4 produces the record laser beam at a high level several tens times the playback laser beam level. With the record laser beam, data pits are formed between the prepits on the optical disk. At this time, the monitor optical sensor 11 produces a photoelectric monitor signal at a high level according to the record laser beam level. The photoelectric monitor signal is amplified into the monitor signal C, as shown in FIG. 2 and then is applied to the envelope detector 13. The envelope detector 13 detects only the envelope at a minimum level of the monitor signal C. Accordingly, the envelope detector 13 produces an envelope signal D at the same low level as that in the playback mode. In this way, the high level component of the monitor signal C is completely removed. Accordingly, also in the record mode, the oscillating output signal from the semiconductor laser oscillator is stabilized by the monitor signal corresponding to the level of the playback laser beam.

Figure 4:
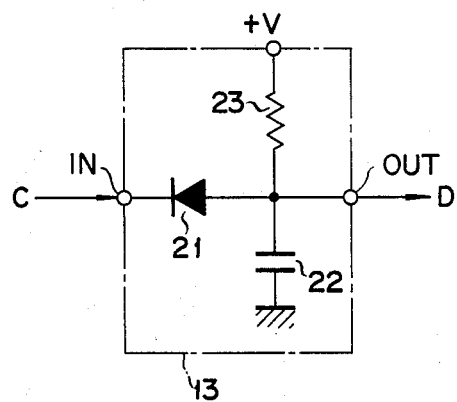
FIG. 4 is a circuit diagram of an envelope detector used in the output stabilizing device shown in FIG. 1.

FIG. 4 is a circuit diagram of the envelope detector 13. In the circuit, the input terminal IN supplied with the signal C is connected to the cathode of the diode 21. The anode of the diode 21 is connected to the output terminal OUT and is connected to the ground terminal and a power source terminal +V, through a capacitor 22 and a resistor 23, respectively.

When the monitor signal C is supplied to the envelope detector 13, the capacitor 22 is charged and discharged according to the minimum value component of the monitor signal C and it produces an envelope signal D corresponding to the minimum value. When the record level component is inputted to the envelope detector 13, the record level component is blocked by the diode and a signal level corresponding to the minimum value component stored in the capacitor 22 is kept at the output terminal OUT. In this way, the minimum value envelope of the monitor signal C is detected.

Figure 5:
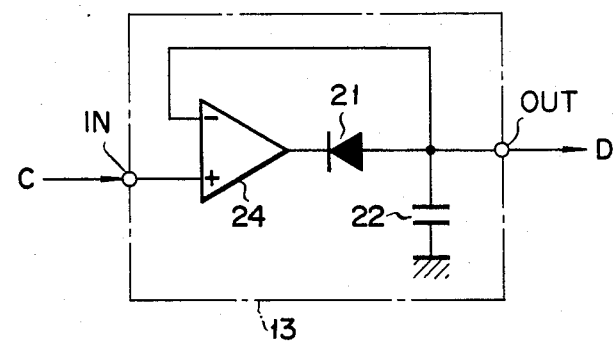
FIG. 5 is a circuit diagram of an envelope detector which is a modification of the FIG. 4 detector.

FIG. 5 shows a modification of the envelope detector 13. In the circuit, the input terminal IN is connected to a non-inverted input terminal of the operational amplifier 24, and the output terminal of an operational amplifier 24 is connected to the cathode of the diode 21. The anode of the diode 21 is connected to the inverted terminal and the output terminal OUT of the envelope detector 13, and is grounded through a capacitor 22.

When the minimum value component of the monitor signal C is supplied to the circuit shown in FIG. 5, the voltage at the non-inverted terminal of the operational amplifier 24 appears at the output terminal OUT. The voltage is kept by the capacitor 22. When the record level component is inputted to the operational amplifier 24, the output voltage corresponding to the operational amplifier 24 is blocked by the diode 21 and the voltage across the capacitor 22, i.e. the voltage of the minimum value component, does not appear at the output terminal OUT. The envelope detector 13 using the operational amplifier 24 can accurately detect the envelope.

Another embodiment of the output stabilizing device according to the present invention will be described referring to FIG. 6. In the embodiment, like reference symbols are used to designate like portions in FIG. 1. According to the present embodiment, the output terminal of the amplifier 12 is connected to one of the input terminals of a differential amplifier 25 and the other input terminal of the differential amplifier 25 is coupled with a signal source (not shown) of a reference signal b for setting the 1 mW oscillating output. The output terminal of the differential amplifier 25 is connected to the input terminal of a sample/hold circuit 26. A signal source (not shown) of a sample and hold switch signal c is connected to a control input terminal of the sample/hold circuit 26. The output terminal of the sample/hold circuit 26 is connected to one of the input terminals of the adder 16 of which the other input terminal is connected to a signal source (not shown) of a beam modulating signal d shown in FIG. 7.

Figure 6:
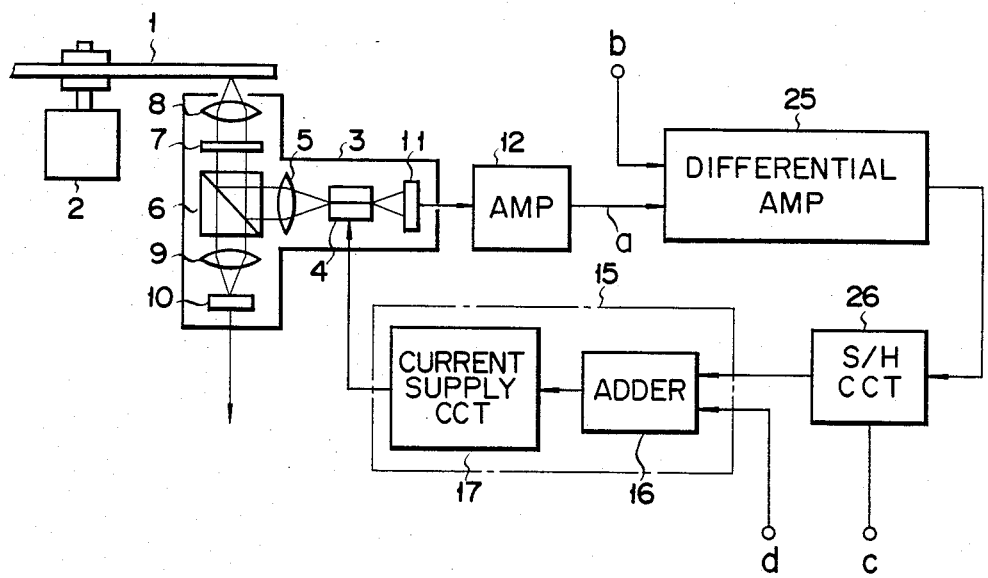
FIG. 6 shows a schematic diagram of an optical disk apparatus using an output stabilizing device according to another embodiment of the present invention.

In the embodiment shown in FIG. 6, the monitor signal a amplified by the amplifier 12 is supplied to the differential amplifier 25. The result is that the differential amplifier 25 produces a signal representing a difference between the monitor signal a and a reference signal b. The difference signal is applied to the sample/hold circuit. At this time, the sample/hold circuit is set to a sampling state by a "1" level of the switch signal c, the difference signal is supplied to the adder 16. At this time, the modulating signal d is at 0 V and hence the adder 16 supplies the difference signal to the current supply circuit 17. Subsequently, the operation similar to that of FIG. 1 will be performed. Then, when the operation of the device is set in a record mode, the switch signal c is at "0" level and the modulating signal d corresponding to the record data is supplied to the adder 16. Since the sample/hold circuit 26 is set in a hold state by a "0" level signal, the difference signal immediately before the switching is held in the adder 16. Accordingly, the adder 16 produces a sum signal of the modulating signal, i.e. the pulse signal d and the difference signal, and then is applied to the current supply circuit 17. The current supply circuit 17 supplies a drive current corresponding to the amplitude of the modulating signal d to the semiconductor laser oscillator 4. At this time, data pits are formed on the optical disk 1 by the record laser beam produced from the laser oscillator 4.

Figure 7:
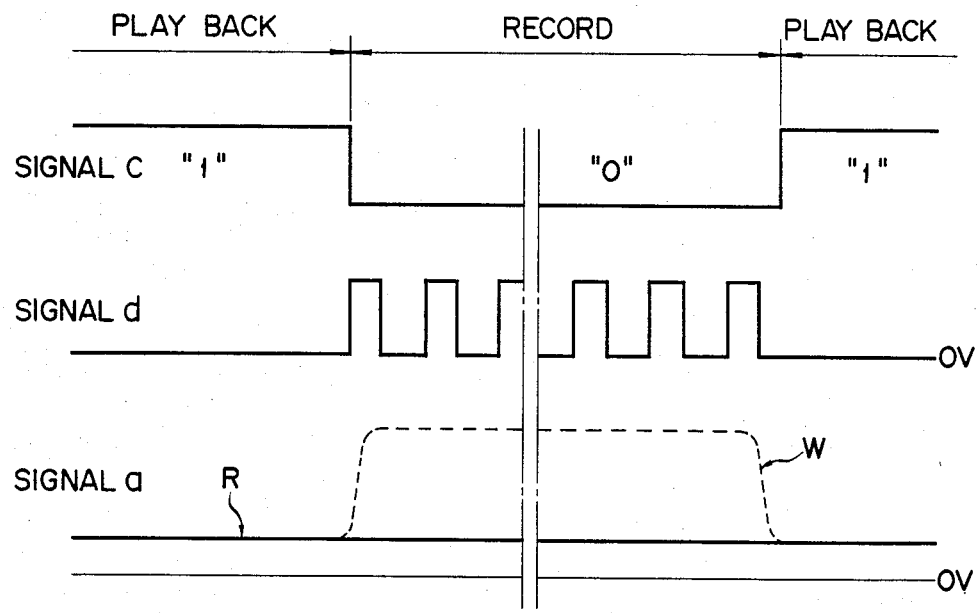
FIG. 7 shows time charts useful in explaining the operation of the FIG. 6 output stabilizing device.

The monitor signal a at this time is a high level signal W as indicated by a broken line in FIG. 7. According to this, the difference signal is also high in level. At this time, the sample/hold circuit 26 is in a holding state. Accordingly, the high level difference signal is not produced from the sample/hold circuit 26, but the difference signal sampled immediately before it is produced. Therefore, the output stabilizing device is little influenced by the high level monitor signal in the record mode, thereby enabling a stable output control to be performed as in the FIG. 1 embodiment.

The sample/hold circuit used in the FIG. 6 embodiment may be replaced by another suitable memory/holding circuit. When the present embodiment is used for a document information filing system, the recording time of one document information is several seconds or less. This fact allows a simple and inexpensive sample/hold circuit to be used for the output stabilizing device of the present invention.

As described above, according to the present invention, only the signal component corresponding to the playback laser beam is extracted. The drive current supply circuit is driven by the sum signal of the playback signal component and the modulating signal to produce a drive current corresponding to the sum signal. Therefore, the semiconductor laser oscillator can produce a stable oscillating output against the temperature change and the record/playback switching. The oscillation threshold current of the semiconductor laser oscillator changes with temperature, but no change of the threshold current occurs within the oscillation region (oscillation output-to-current). Therefore, the stabilization of the oscillating output power against the recording beam and the temperature change can both be realized, enabling a more stable recording. Additionally, the oscillation output levels for the record beam and the playback beam can individually be set.

While in the above-embodiment, the oscillation output is stabilized by the monitor laser beam, the playback beam or the record beam can be used for the same purpose.

What is claimed is:

1. An output stabilizing device for use in a semiconductor laser system including a semiconductor laser oscillator, said system having a record mode and a playback mode, said device comprising:

optical sensor means for detecting a record laser beam and for detecting a playback laser beam and for outputting a monitor signal corresponding to the detected record or playback laser beam;

means for detecting a difference between a signal component of said monitor signal, and a reference signal, said means for detecting being used for setting a level of the playback laser beam, to thereby produce a playback component difference signal; and modulation drive means for adding a beam modulating signal to the playback component difference signal of said difference detecting means to generate an added signal and for providing a stabilized drive current output having an amplitude varied in accordance with the added signal to said semiconductor laser oscillator.

2. An output stabilizing device according to claim 1, wherein said difference detecting means includes an envelope detector for detecting a minimum envelope of said monitor signal to produce a minimum envelope signal, and a comparator for comparing the minimum envelope signal from said envelope detector with the reference signal, to thereby produce said playback component difference signal.

3. An output stabilizing device according to claim 1, wherein said difference detecting means includes means for detecting a difference between said monitor signal and said reference signal to produce a monitor difference signal, and means for sampling in said playback mode the monitor difference signal and for holding the monitor difference signal in said record mode in order to produce said playback component difference signal;

4. An output stabilizing device according to claim 2, wherein said envelope detector is comprised of a diode backwardly connected between said optical sensor means and said comparator, a capacitor connected between a connection point of said diode with said comparator and a ground terminal, and a resistor connected between said connection point and a power source terminal.

5. An output stabilizing device according to claim 2, wherein said envelope detector is comprised of an operational amplifier having first and second input terminals and an output terminal with said first input terminal connected to said optical sensor means, a diode backwardly connected between the output terminal of said operational amplifier and said comparator to form a connection point, a capacitor connected between the connection point of said diode with said comparator and a ground terminal and a second input terminal of said operational amplifier connected to said connection point.

6. An output stabilizing device according to any one of claim 1, 2 or 3, wherein said drive means includes an adder for adding the playback component difference signal from said difference detecting means to the beam modulating signal to generate said added signal, and means for producing a drive current with a level corresponding to a level of the added signal from said adder.

* * * * *